(12) United States Patent
Hata et al.

(10) Patent No.: US 8,189,296 B2
(45) Date of Patent: May 29, 2012

(54) THIN-FILM PIEZOELECTRIC DEVICE, PRODUCTION METHOD THEREOF, HEAD GIMBALS ASSEMBLY USING THE THIN-FILM PIEZOELECTRIC DEVICE, AND HARD DISK USING THE HEAD GIMBALS ASSEMBLY

(75) Inventors: Kenjiro Hata, Tokyo (JP); Hirofumi Sasaki, Tokyo (JP); Katsuyuki Kurachi, Tokyo (JP)

(73) Assignees: TDK Corporation, Tokyo (JP); SAE Magnetics (HK), Ltd., Hong Kong (CN)

( * ) Notice: Subject to any disclaimer, the term of this patent is extended or adjusted under 35 U.S.C. 154(b) by 282 days.

(21) Appl. No.: 12/579,766

(22) Filed: Oct. 15, 2009

(65) Prior Publication Data
US 2010/0097723 A1    Apr. 22, 2010

(30) Foreign Application Priority Data
Oct. 21, 2008  (JP) ................ P2008-271306

(51) Int. Cl.
*G11B 5/48*    (2006.01)
(52) U.S. Cl. ................................. 360/245.3
(58) Field of Classification Search ............... 360/294.4
See application file for complete search history.

(56) References Cited

U.S. PATENT DOCUMENTS

| | | | |
|---|---|---|---|
| 6,142,614 A | 11/2000 | Hashizume et al. | |
| 6,597,541 B2* | 7/2003 | Nishida et al. | 360/294.4 |
| 6,666,943 B2 | 12/2003 | Wada et al. | |
| 6,791,802 B2* | 9/2004 | Watanabe et al. | 360/294.4 |
| 6,912,760 B2 | 7/2005 | Uchiyama et al. | |
| 7,072,150 B2* | 7/2006 | Kuwajima et al. | 360/294.4 |
| 7,247,975 B2 | 7/2007 | Tochi et al. | |
| 7,420,785 B2* | 9/2008 | Yamazaki et al. | 360/294.4 |
| 7,439,655 B2 | 10/2008 | Asano et al. | |
| 2002/0075606 A1* | 6/2002 | Nishida et al. | 360/294.4 |
| 2008/0203856 A1 | 8/2008 | Miyazawa | |
| 2009/0080119 A1* | 3/2009 | Kurihara et al. | 360/313 |
| 2009/0284872 A1* | 11/2009 | Hida et al. | 360/294.4 |

FOREIGN PATENT DOCUMENTS

| | | |
|---|---|---|
| JP | A-10-211701 | 8/1998 |
| JP | A-2002-134807 | 5/2002 |
| JP | A-2002-237626 | 8/2002 |
| JP | A-2002-251853 | 9/2002 |
| JP | A-2003-101095 | 4/2003 |
| JP | A-2005-286037 | 10/2005 |
| JP | A-2006-303044 | 11/2006 |
| JP | A-2007-13009 | 1/2007 |
| JP | A-2007-95275 | 4/2007 |
| JP | A-2008-211140 | 9/2008 |

* cited by examiner

*Primary Examiner* — Mark Blouin
(74) *Attorney, Agent, or Firm* — Oliff & Berridge, PLC

(57) ABSTRACT

A method includes a step of stacking a first electrode layer, a piezoelectric layer, and a second electrode layer on a first substrate to form a first laminate; a step of stacking a support layer on a second substrate to form a second laminate; a step of bonding the first and second laminates through an adhesive layer to form a third laminate; a step of removing the first substrate from the third laminate; a step of processing the third laminate in a desired shape; and a step of removing the second substrate. A Young's modulus of the adhesive layer is smaller than a Young's modulus of the piezoelectric layer. Respective Young's moduli of the second electrode layer and the support layer are larger than the Young's modulus of the adhesive layer. The third laminate has no other piezoelectric layer except for the aforementioned piezoelectric layer.

7 Claims, 11 Drawing Sheets

THIN-FILM PIEZOELECTRIC DEVICE, PRODUCTION METHOD THEREOF, HEAD GIMBALS ASSEMBLY USING THE THIN-FILM PIEZOELECTRIC DEVICE, AND HARD DISK USING THE HEAD GIMBALS ASSEMBLY

BACKGROUND OF THE INVENTION

1. Field of the Invention

The present invention relates to a thin-film piezoelectric device used for fine positioning by inverse piezoelectric effect of piezoelectric layer, a production method thereof, and a head gimbals assembly using the thin-film piezoelectric device and, more particularly, to a positioning structure for a magnetic head which performs reading and writing of recording information in a magnetic recording disk device.

2. Related Background Art

The recent approach toward higher density and larger capacity of magnetic recording (hard disk) increases the necessity for a thin-film piezoelectric device as a high-accuracy positioning mechanism of tracking. For example, Patent Literatures 1-3 below disclose the thin-film piezoelectric devices of this kind.

Patent Literature 1 (Japanese Patent Application Laid-open No. 2005-286037) discloses the thin-film piezoelectric device in which a piezoelectric laminate 21A wherein a piezoelectric layer 16A is interposed between a pair of electrode layers 14A, 18A and a piezoelectric laminate 21B wherein a piezoelectric layer 16B is interposed between a pair of electrode layers 14B, 18B are superimposed through an adhesive layer 12. Patent Literature 2 (Japanese Patent Application Laid-open No. 2002-34807) discloses the thin-film piezoelectric device composed of a pair of thin-film piezoelectric devices 10A and 10B in a double-layer structure of first thin-film piezoelectric 11A and second thin-film piezoelectric 11B electrically short-circuited through an electroconductive adhesive 13. Patent Literature 3 (Japanese Patent Application Laid-open No. 2003-101095) discloses the thin-film piezoelectric device in which a structure 66 is formed in a configuration wherein a first piezoelectric thin layer 53 sandwiched between first lower electrode layer 52 and first upper electrode layer 54 and a second piezoelectric thin layer 57 sandwiched between second lower electrode layer 56 and second upper electrode layer 58 are bonded through an adhesive layer 60, and in which an insulating layer 62 is formed so as to cover the structure 66.

However, all the thin-film piezoelectric devices disclosed in Patent Literatures 1-3 have the two piezoelectric laminates including the respective piezoelectric layers and this configuration makes it difficult to satisfy the market demands of mass productivity and low price. The reason why the presently existing thin-film piezoelectric devices adopt this double-layered piezoelectric laminate structure, is that the thin-film piezoelectric devices are comprised of thin layers. Specifically, during a process of depositing layers including the piezoelectric layer on a substrate, the substrate is warped by various stresses due to heat, lattice constant mismatch, etc. and thus the thin-film piezoelectric device obtained through the production process is also largely warped. The warpage will cause displacement in a direction different from an aimed direction of the piezoelectric laminate in the thin-film piezoelectric device (which will be referred to hereinafter as flexural displacement). When the conventional thin-film piezoelectric device with the two piezoelectric laminates is operated, the displacement directions of the two piezoelectric laminates are matched to suppress the flexural displacement so as to achieve displacement in the longitudinal direction as aimed; therefore, the piezoelectric device has to be constructed in the laminated structure of the two piezoelectric laminates. For this reason, a single-layered piezoelectric laminate structure failed to achieve higher performance and higher reliability of the thin-film piezoelectric device and an apparatus incorporating the thin-film piezoelectric device of this structure inevitably suffered breakage, trouble, and so on.

Because of the above problem, the double-layered piezoelectric laminate structure consisting of the two layers of piezoelectric laminates bonded was adopted to cancel the warpage during production and during operation, thereby suppressing deformation of the device and suppressing the flexural displacement.

The present invention has been accomplished in light of the above-described problem and an object of the present invention is to provide a thin-film piezoelectric device capable of achieving higher performance, higher reliability, and lower cost by a single-layer piezoelectric laminate, a production method thereof, and a head gimbals assembly and a hard disk drive using the thin-film piezoelectric device.

SUMMARY OF THE INVENTION

In order to solve the aforementioned problem, a production method of a thin-film piezoelectric device according to the present invention is a method for producing a thin-film piezoelectric device, comprising: a step of stacking a first electrode layer, a piezoelectric layer, and a second electrode layer in order on a first substrate to form a first laminate; a step of stacking a support layer on a second substrate to form a second laminate; a step of bonding the first laminate and the second laminate through an adhesive layer so that the second electrode layer and the support layer are opposed to each other, to form a third laminate consisting of the first laminate, the adhesive layer, and the second laminate; a step of removing the first substrate from the third laminate; a step of processing the third laminate in a desired shape, after the step of removing the first substrate; and a step of removing the second substrate, after the step of processing the third laminate, wherein a Young's modulus of the adhesive layer is smaller than a Young's modulus of the piezoelectric layer, wherein respective Youngs moduli of the second electrode layer and the support layer are larger than the Young's modulus of the adhesive layer, and wherein the third laminate has no other piezoelectric layer except for the aforementioned piezoelectric layer.

In the production method of the thin-film piezoelectric device according to the present invention, first, the first laminate including one piezoelectric layer is bonded through the adhesive layer to the second laminate including no piezoelectric layer, to form the third laminate being a single-layer piezoelectric laminate. Thereafter, the thin-film piezoelectric device is completed through the step of removing the first substrate from the third laminate, the step of processing the third laminate in the desired shape, and the step of removing the second substrate.

In the production method of the thin-film piezoelectric device, therefore, various stresses generated between the piezoelectric layer and the first substrate due to heat, crystal lattice constant mismatch, etc. in the first laminate forming step are released by removal of the first substrate in the first substrate removing step and the various stresses thus released are transferred to the second substrate. At this time, since the adhesive layer of the material with the Young's modulus smaller than that of the piezoelectric layer is interposed between the piezoelectric layer and the second substrate, the various stresses to be transferred to the second substrate are relaxed by the adhesive layer. For this reason, the warpage and flexural displacement of the device is effectively suppressed even though the thin-film piezoelectric device obtained by the production method of the present invention consists of the single-layer piezoelectric laminate. Since the device of the present invention adopts the structure in which the adhesive layer is sandwiched between the second electrode layer and the support layer and in which the respective Young's moduli of the second electrode layer and the support layer are larger than the Young's modulus of the adhesive layer, the warpage and flexural displacement of the device is more suppressed. Since the device consists of the single-layer piezoelectric laminate, the production cost thereof is reduced. Therefore, the production method of the thin-film piezoelectric device according to the present invention permits us to readily produce the thin-film piezoelectric device capable of achieving higher performance, higher reliability, and lower cost by the single-layer piezoelectric laminate.

Preferably, the step of forming the third laminate comprises forming the adhesive layer by thermally curing an adhesive, and respective coefficients of thermal expansion of the second electrode layer and the support layer are smaller than a coefficient of thermal expansion of the adhesive layer. In this case, when contraction occurs because of thermal cure in the step of forming the third laminate consisting of the first laminate, the adhesive layer, and the second laminate by bonding through the adhesive layer, tensile stresses are applied toward the center of the adhesive layer because of the difference between the coefficients of thermal expansion of the second electrode layer and support layer and the coefficient of thermal expansion of the adhesive layer, and thus the stresses cancel each other to reduce the warpage of the third laminate.

A thin-film piezoelectric device according to the present invention is a thin-film piezoelectric device comprising a laminate in which a support layer, an adhesive layer, a second electrode layer, a piezoelectric layer, and a first electrode layer are stacked in order, wherein a Young's modulus of the adhesive layer is smaller than a Young's modulus of the piezoelectric layer, wherein respective Young's moduli of the second electrode layer and the support layer are larger than the Young's modulus of the adhesive layer, and wherein the thin-film piezoelectric device has no other piezoelectric layer except for the aforementioned piezoelectric layer.

The thin-film piezoelectric device according to the present invention has the single-layer piezoelectric laminate having no other piezoelectric layer except the piezoelectric layer in the laminate and further comprises the adhesive layer. The Young's modulus of the adhesive layer is smaller than that of the piezoelectric layer. For this reason, the adhesive layer relaxes stress generated and released in the piezoelectric layer. As a consequence, the warpage and flexural displacement of the device is effectively suppressed even though the thin-film piezoelectric device of the present invention consists of the single-layer piezoelectric laminate. Since the device of the present invention adopts the structure in which the adhesive layer is sandwiched between the second electrode layer and the support layer and in which the respective Young's moduli of the second electrode layer and the support layer are larger than that of the adhesive layer, the warpage and flexural displacement of the device is more suppressed. Since the device consists of the single-layer piezoelectric laminate, the production cost thereof is reduced. Therefore, the thin-film piezoelectric device of the present invention is one capable of achieving higher performance, higher reliability, and lower cost by the single-layer piezoelectric laminate.

The thin-film piezoelectric device preferably further comprises an insulating layer covering a surface of the piezoelectric layer. It can insulate and protect the surface of the piezoelectric layer.

The thin-film piezoelectric device preferably further comprises an insulating layer hermetically sealing the laminate. When the insulating layer hermetically seals the laminate being the single-layer piezoelectric laminate in this manner, the reduced warpage of the laminate is further canceled and the laminate is prevented from being damaged by external stress. It also further prevents moisture absorption and corrosion of the device and thus ensures higher reliability of the device.

A head gimbals assembly according to the present invention is a head gimbals assembly comprising: a head slider having a thin-film magnetic head which performs at least either recording or reproduction with a recording medium; a suspension on which the head slider is mounted; and a thin-film piezoelectric device mounted on a mounting surface of the suspension and configured to displace the head slider relative to the suspension, wherein the thin-film piezoelectric device is a device comprising a laminate in which a support layer, an adhesive layer, a second electrode layer, a piezoelectric layer, and a first electrode layer are stacked in order, wherein a Young's modulus of the adhesive layer is smaller than a Young's modulus of the piezoelectric layer, wherein respective Young's moduli of the second electrode layer and the support layer are larger than the Young's modulus of the adhesive layer, and wherein the thin-film piezoelectric device has no other piezoelectric layer except for the aforementioned piezoelectric layer.

A hard disk drive according to the present invention comprises the above-described head gimbals assembly.

Since the head gimbals assembly according to the present invention adopts the above-described configuration, it is feasible to achieve higher performance, higher reliability, and lower cost of apparatus.

The present invention provides the thin-film piezoelectric device capable of achieving higher performance, higher reliability and lower cost by the single-layer piezoelectric laminate, the production method thereof, and the head gimbals assembly using the thin-film piezoelectric device.

DESCRIPTION OF THE PREFERRED EMBODIMENTS

The preferred embodiment of thin-film piezo actuator (thin-film piezoelectric device) 40 and Head Gimbals Assembly (HGA) 10 according to the present invention will be described below in detail with reference to the accompanying drawings. In the description of the drawings the same elements will be denoted by the same reference symbols, without redundant description.

Figure 1:
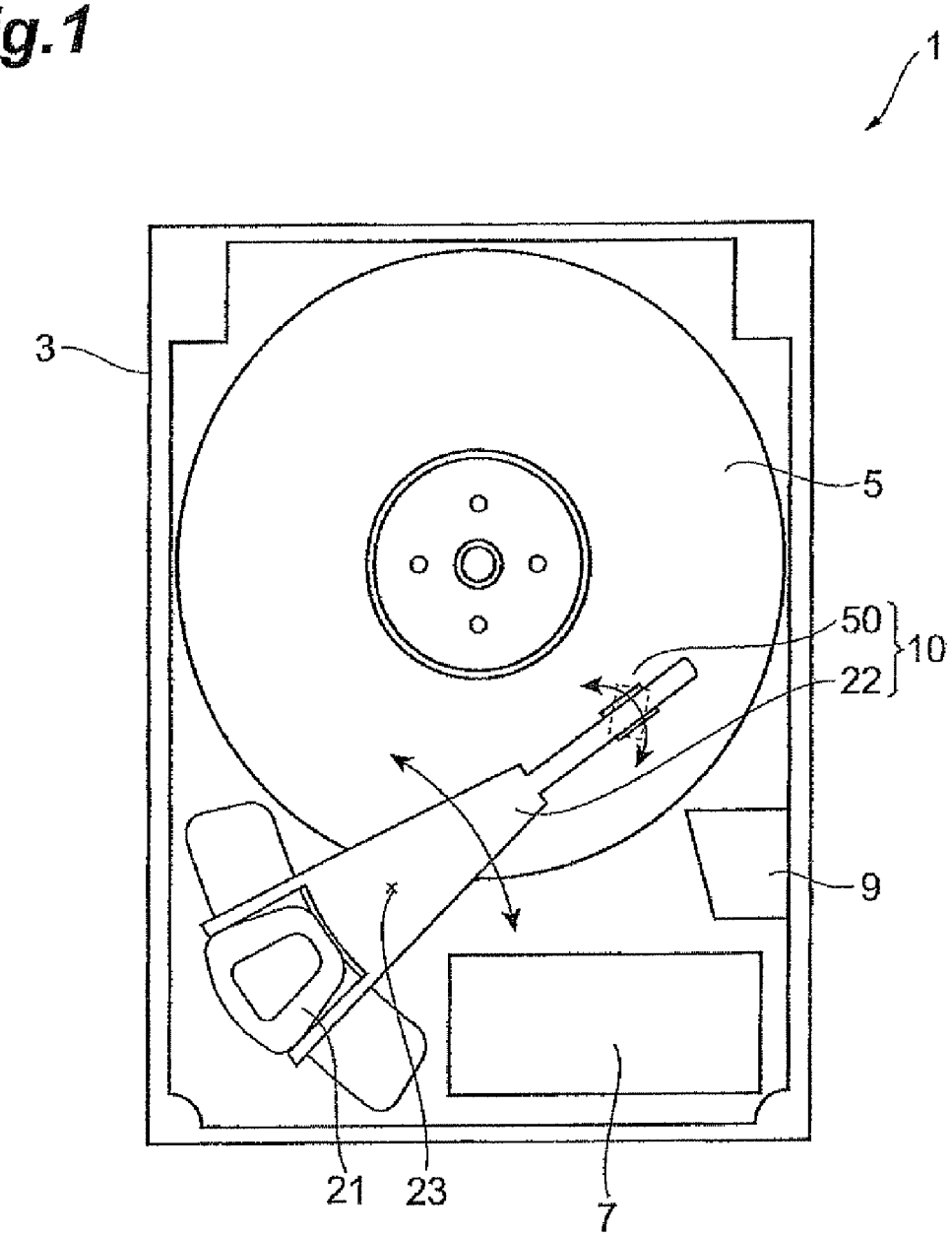
FIG. 1 is a drawing showing a hard disk device with HGA according to an embodiment of the present invention.

First, prior to the description of the thin-film piezo actuator 40 and HGA 10 according to the embodiment, an example of hard disk device (hard disk drive) 1 to which they are applied will be described. FIG. 1 is a drawing showing the hard disk device 1 equipped with HGA 10 according to the present embodiment. The hard disk device 1 is a device that actuates HGA 10 to record and reproduce magnetic information in and from a recording surface of hard disk 5 under high-speed rotation by thin-film magnetic head 51 of head slider 50.

The hard disk device 1 comprises the hard disk 5 as a recording medium, HGA 10 for recording and reproduction of magnetic information in and from the hard disk 5, a controller 7 for controlling such operations as recording and reproduction of magnetic information in and from the hard disk 5 by HGA 10, and a ramp mechanism 9 for making below-described thin-film magnetic head 51 retracted from a position above the hard disk 5, in housing 3.

The hard disk 5 is rotated by a motor not shown. HGA 10 is rockable around an axis 23 by voice coil motor (VCM) 21 and has a head slider 50 attached so as to face the hard disk 5.

Figure 2:
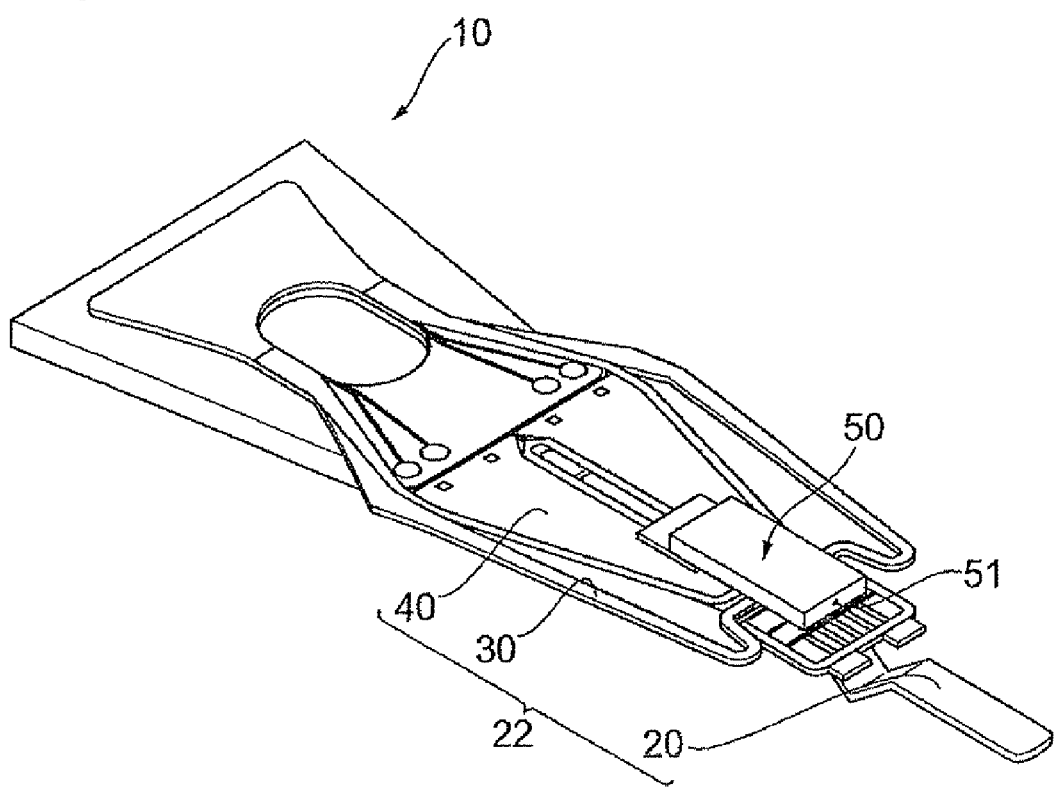
FIG. 2 is an enlarged perspective view of HGA shown in FIG. 1.
Figure 3:
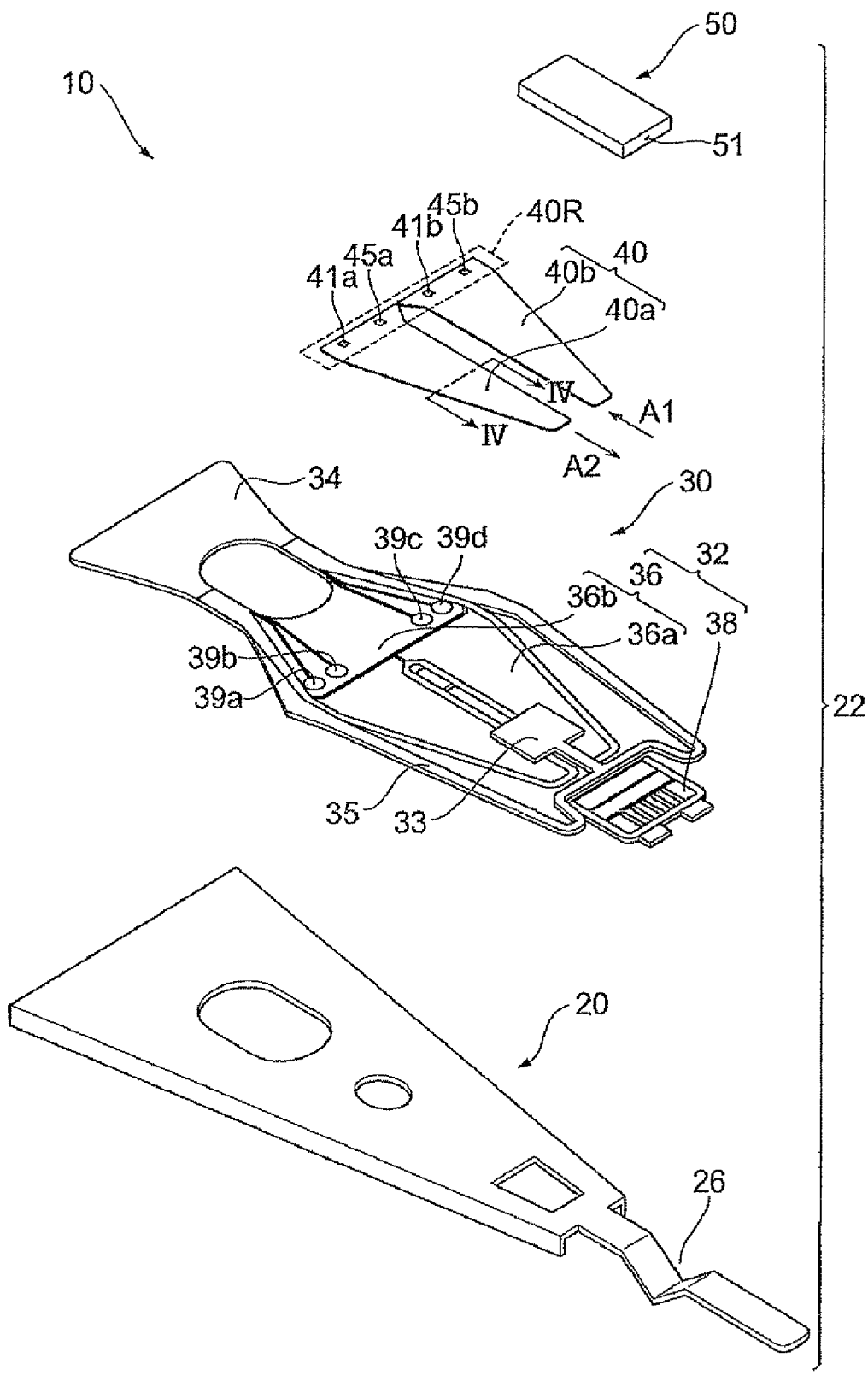
FIG. 3 is an exploded perspective view of HGA shown in FIG. 2.

A configuration of HGA 10 will be described below in detail. FIG. 2 is an enlarged perspective view of HGA 10 shown in FIG. 1 and FIG. 3 is an exploded perspective view of HGA 10 shown in FIG. 2. As shown in FIGS. 2 and 3, HGA 10 has a suspension 22 consisting of a suspension arm 20, a flexure 30, and a thin-film piezo actuator 40, and a head slider 50 mounted on the suspension 22. The thin-film piezo actuator 40 displaces the head slider 50 relative to the suspension arm 20. HGA 10 can move the thin-film magnetic head 51 in two stages, since HGA 10 has the thin-film piezo actuator 40. Namely, relatively large movement of the thin-film magnetic head 51 is controlled by drive of the entire suspension 22 by VCM 21 and fine movement is controlled by drive of the head slider 50 by the thin-film piezo actuator 40.

The suspension arm 20 is made of metal and is provided with a tab 26 at a distal end thereof for running on a slope during retraction of head slider 50 to the ramp mechanism 9.

The flexure 30, as shown in FIG. 3, is composed of a flexible wiring substrate 32 made of polyimide resin or the like, and a support plate 34 made of stainless steel and partially attached to a bottom surface of the wiring substrate 32, and is bonded to the suspension arm 20 by laser spot welding.

The wiring substrate 32 is composed of a piezo actuator mounting region 36 and a head slider mounting region 38. The piezo actuator mounting region 36 has a shape corresponding to the shape of thin-film piezo actuator 40 and has a front end 36a on which the thin-film piezo actuator 40 is mounted, and a rear end 36b on which electrode pads 39a-d for thin-film piezo actuator 40 and electrode pads (not shown), e.g., for recording electrodes and reproducing electrodes for head slider 50 are formed.

The head slider mounting region 38 includes a region continuous to the tip side of the front end 36a of piezo actuator mounting region 36, in which recording electrodes (not shown) and reproducing electrodes (not shown) to be connected to respective recording pads and reproducing pads of the head slider 50 are arrayed. The recording electrodes and reproducing electrodes arrayed on this head slider mounting region 38 are electrically connected to corresponding electrode pads on the rear end 36b of flexure 30 by a plurality of wires on the wiring substrate 32 by such a method as solder ball bonding.

The flexure 30 is provided with a displacement transfer plate 33 which is located in a central region of the front end 36a of the piezo actuator mounting region 36 and apart from the head slider mounting region 38 and on which the rear end of the head slider 50 mounted on the head slider mounting region 38 is mounted. The displacement transfer plate 33 is integrated with the support plate 34 while being connected to a curved wing 35 extending along the outside of the front end 36a from the support plate 34 attached to the rear end 36b of the piezo actuator mounting region 36. In a state in which the thin-film piezo actuator 40 is mounted on the piezo actuator mounting region 36 and in which the head slider 50 is mounted on the head slider mounting region 38 and the displacement transfer plate 33, the top surface of the displacement transfer plate 33 becomes opposed to the bottom surface of the head slider 50 and the bottom surface of the displacement transfer plate 33 becomes opposed to the top surface of the thin-film piezo actuator 40. The displacement transfer plate 33 transfers displacement of the thin-film piezo actuator 40 to the head slider 50 during operation of the thin-film piezo actuator 40. The displacement transfer plate 33 and wing 35 are made of stainless steel as the support plate 34 is.

Figure 4:
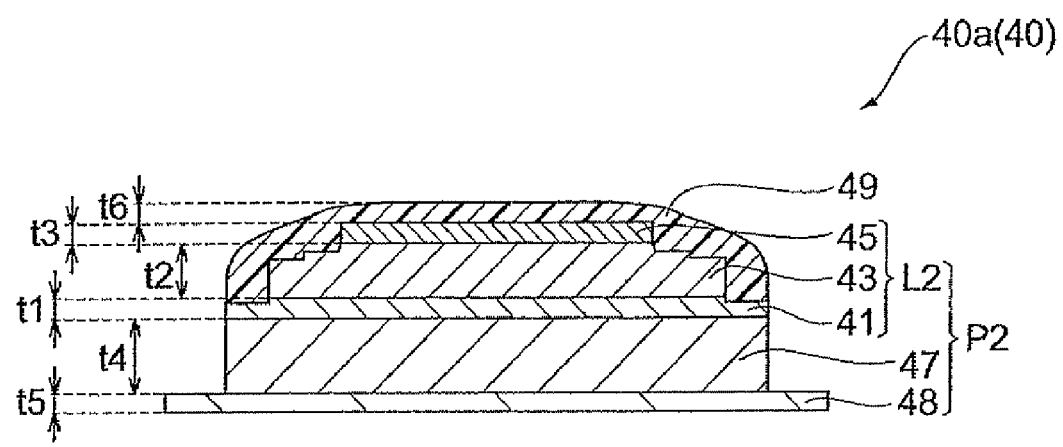
FIG. 4 is a drawing showing a thin-film piezo actuator according to an embodiment of the present invention.

The details of the thin-film piezo actuator 40 will be described below with reference to FIGS. 3 and 4. FIG. 4 is a schematic diagram showing a sectional configuration along a line IV-IV in FIG. 3. The thin-film piezo actuator 40 has a first region 40a and a second region 40b which are configured so as to expand and contract in different directions and separated from each other. The first region 40a and the second region 40b are arranged so that their respective inside edges opposed to each other extend with a space and in parallel and so that their respective outside edges gradually narrow from a base region 40R toward the tip. The thin-film piezo actuator 40 may be configured so that the first and second regions are connected in the base region 40k.

The base region 40R of the first region 40a is provided with electrodes 41a, 45a to which a drive voltage is applied, and the base region 40k of the second region 40b is provided with electrodes 41b, 45b to which a drive voltage is applied. The first region 40a and the second region 40b of the thin-film piezo actuator 40 are bonded each to the piezo actuator mounting region 36 of flexure 30 by ultraviolet curing resin and the electrodes 41a, 45a, 41b, 45b are connected to the electrode pads 39a-d, respectively, by solder ball bonding. Since the first region 40a and the second region 40b have the same configuration, the following description will be given with focus on the first region 40a while avoiding redundant description. The first region 40a comprises a laminate L2 formed in a structure in which a second electrode layer 41, a piezoelectric layer 43, and a first electrode layer 45 are stacked in order, an adhesive layer 47 and a support layer 48 provided in order below the second electrode layer 41, and a resin layer (insulating layer) 49 covering the surface of the laminate L2.

Each of the electrode 41a on the first region 40a and the electrode 41b on the second region 40b in the base region 40R is connected, for example, through a contact hole to the corresponding second electrode layer 41 and each of the electrode 45a on the first region 40a and the electrode 45b on the second region 40b is connected, for example, through a contact hole to the corresponding first electrode layer 45. This configuration allows mutually opposite biases to be applied to the electrodes 41a, 45a on the first region 40a and to the electrodes 41b, 45b on the second region 40b, for example, with the result that the piezoelectric layer 43 in the first region 40a is contracted in the direction of arrow A1 in FIG. 3 and the piezoelectric layer 43 in the second region 40b is expanded in the direction of arrow A2.

There are no particular restrictions on a material of the second electrode layer 41 as long as it is an electroconductive material; for example, the material of the second electrode layer 41 can be a metal material such as Pt (Young's modulus: 152 GPa, coefficient of thermal expansion: 8.8 ppm/° C.) or Au (Young's modulus: 77.2 GPa, coefficient of thermal expansion: 14.4 ppm/° C.). It is also possible to use electroconductive ceramics such as $SrRuO_3$ (SRO). Furthermore, the second electrode layer 41 may be constructed in a multilayer structure, for the purpose of adjusting adhesion to constituent materials located above and below the second electrode layer 41, and overall stress. There are no particular restrictions on the thickness t1 of the second electrode layer 41, but it can be, for example, approximately 0.1-1 μm. Since an increase in the thickness of electrode layer 41 can become a hindrance to displacement amount, the thickness of the electrode layer 41 is preferably smaller than the thickness of the adhesive layer 47. This is based on the fact that flexure suppression support stiffness and longitudinal displacement amount are in a trade-off relation.

There are no particular restrictions on a material of the piezoelectric layer 43 as long as it exhibits the piezoelectric characteristic; for example, the material of the piezoelectric layer 43 can be PZT (lead zirconate titanate, Young's modulus: 47-95 GPa). There are no particular restrictions on the thickness t2 of the piezoelectric layer 43, but it can be, for example, approximately 0.5-10 μm.

The first electrode layer 45 is the same as the second electrode layer 41. There are no particular restrictions on the thickness t3 of the first electrode layer 45, but it can be, for example, approximately 0.1-1 μm.

There are no particular restrictions on a material of the adhesive layer 47 as long as it can bond the second electrode layer 41 and the support layer 48; for example, the material of the adhesive layer 47 can be selected from resin adhesives such as epoxy resin (Young's modulus: 3.1 GPa, coefficient of thermal expansion: 60 ppm/° C.), acrylic resin (Young's modulus: 3.1 GPa, coefficient of thermal expansion: 60 ppm/° C.), silicone resin (Young's modulus: about 0.7 GPa, coefficient of thermal expansion: about 200 ppm/° C.), polyimide resin (Young's modulus: 10 GPa, coefficient of thermal expansion: 36 ppm/° C.), fluororesin (Young's modulus: 1.3 GPa, coefficient of thermal expansion: 60 ppm/° C.), polyimide silicon resin (Young's modulus: 2.4 GPa, coefficient of thermal expansion: 60 ppm/° C.), and benzocyclobutene (BCB) resin (Young's modulus: 2.9 GPa, coefficient of thermal expansion: 52 ppm/° C.), and solders (soft solders) such as Sn/Ag type (Young's modulus: 40-50 GPa, coefficient of thermal expansion: 50 ppm/° C.). Particularly, a thermosetting resin adhesive thermally cured is preferred among the resin adhesives. There are no particular restrictions on the thickness t4 of the adhesive layer 47, but it can be, for example, approximately 1-30 μm.

There are no particular restrictions on a material of the support layer 48 as long as it is a material with hardness approximately equal to that of the second electrode layer 41; for example, the material of the support layer 48 can be a metal material such as Pt (Young's modulus: 152 GPa, coefficient of thermal expansion: 8.8 ppm/° C.) or Au (Young's modulus: 77.2 GPa, coefficient of thermal expansion: 14.4 ppm/° C.). It is also possible to use electroconductive ceramics such as SRO. Furthermore, the support layer 48 may be constructed in a multilayer structure, for the purpose of adjusting adhesion to constituent materials located above and below the support layer 48, and overall stress. There are no particular restrictions on the thickness t5 of the support layer 48, but it can be, for example, approximately 0.1-1 μm.

There are no particular restrictions on a material of the resin layer 49 as long as it is adhesive to the laminate L2 and can cover the surface of the laminate L2; for example, the material of the resin layer 49 can be the same as the adhesive layer 47. There are no particular restrictions on the thickness t6 of the resin layer 49, but the thickness t6 can be, for example, approximately 0.3-30 μm. This constituent member may be a material such as insulating ceramics instead of the resin and there are no particular restrictions on the thickness thereof, it can be approximately 0.005-1 μm.

It is necessary herein that the Young's modulus of the adhesive layer 47 be smaller than the Young's modulus of the piezoelectric layer 43 and that the respective Young's moduli of the second electrode layer 41 and the support layer 48 be larger than the Young's modulus of the adhesive layer 47. It is also necessary that the respective coefficients of thermal expansion of the second electrode layer 41 and the support layer 48 be smaller than that of the adhesive layer 47. An example of combinations of most preferred materials is Pt/PZT/Pt/epoxy resin/Pt/polyimide resin for second electrode layer 41/piezoelectric layer 43/first electrode layer 45/adhesive layer 47/support layer 48/resin layer 49.

The operation of the thin-film piezo actuator 40 according to the present embodiment will be described below in association with displacement amount u(l) of the piezoelectric layer 43. The displacement amount u(l) of the piezoelectric layer 43 of thin-film piezo actuator 40 can be represented as follows.

$$u(l) = \frac{nt_{pzt}E_{pzt}}{nt_{pzt}E_{pzt} + \sum_i t_i E_i} d_{31} L \frac{V}{t_{pzt}} \qquad (1)$$

In this formula, n represents the number of layers of piezoelectric layer 43 (n=1 herein), i each layer, $t_i$ an equivalent thickness of each layer i, $t_{PZT}$ an equivalent thickness of piezoelectric layer 43, $E_i$ the Young's modulus of each layer i, $E_{PZT}$ the Young's modulus of piezoelectric layer 43, $d_{31}$ the piezoelectric constant in direction $d_{31}$ (longitudinal direction of piezoelectric layer 43, or direction A1 or A2 in FIG. 3), L the longitudinal length of piezoelectric layer 43, and $V/t_{PZT}$ electric field intensity associated with the piezoelectric layer 43. Each layer i includes, specifically, the second electrode layer 41, the first electrode layer 45, the adhesive layer 47, and the support layer 48.

Formula (1) above can be simplified into Formula (2) below, using the relation of $P_i = E_i \times t_i$. In Formula (2), $E_i$ represents the Young's modulus of each layer i, $t_i$ the thickness of each layer i, and $P_i$ the stiffness factor of each layer i.

$$u(l) = \frac{nP_{pzt}}{nP_{pzt} + \sum_i P_i} d_{31} L \frac{V}{t_{pzt}} \quad (2)$$

As shown in this Formula (2), when the piezoelectric constant $d_{31}$ of material and the actuator length L are determined, the displacement amount u(l) can be controlled by adjusting the electric field intensity of $V/t_{PZT}$. However, since the piezoelectric layer 43 is a thin layer, it is also affected by the stiffness factors of the second electrode layer 41, first electrode layer 45, and adhesive layer 47. Since in the present embodiment the Young's modulus of the adhesive layer 47 forming the thin-film piezo actuator 40 is smaller than that of the piezoelectric layer 43, the overall value of $P_i$ can be maintained at a relatively low level and it is thus feasible to suppress reduction in a ratio of $P_{PZT}$ to overall value of $P_i$ (which will be referred to hereinafter as stiffness occupancy). As a consequence, reduction in displacement amount u(l) can be suppressed.

Since the Young's modulus of the adhesive layer 47 is smaller than that of the piezoelectric layer 43, the adhesive layer 47 relaxes stress generated in the piezoelectric layer 43 and released therefrom, during production of the thin-film piezo actuator 40. For this reason, warpage and flexural displacement of the device is effectively suppressed even though the thin-film piezo actuator 40 consists of the single-layer piezoelectric laminate. This suppresses loss of displacement amount u(l) due to flexural displacement and displacement can be efficiently generated in the aimed displacement direction (direction $d_{31}$). Furthermore, the adhesive layer 47 is sandwiched between the second electrode layer 41 and the support layer 48 and the respective Young's moduli of the second electrode layer 41 and the support layer 48 are larger than that of the adhesive layer 47. For this reason, warpage and flexural displacement of the device is further suppressed. Since the actuator consists of the single-layer piezoelectric laminate, production cost thereof can be reduced. Therefore, the thin-film piezo actuator 40 achieves higher performance, higher reliability, and lower cost by the single-layer piezoelectric laminate.

Since the thin-film piezo actuator 40 has the resin layer 49 covering the surface of the laminate L2, it can insulate and protect the surface of the piezoelectric layer 43 having no contact with the second electrode layer 41 and the first electrode layer 45:

In the thin-film piezo actuator 40 of the present embodiment, the second electrode layer 41, adhesive layer 47, and support layer 48 function as a support body supporting the piezoelectric layer 43 and the total thickness of these layers 41, 47, and 48 is preferably larger than the thickness of the piezoelectric layer 43 to induce displacement. In this case, stress is suitably controlled in the thickness direction of the laminate in the thin-film piezo actuator 40 of the present embodiment, whereby the longitudinal displacement to be aimed can be achieved while extremely highly suppressing the displacement in the flexural direction, during driving of the thin-film piezo actuator 40. The Young's modulus of the entire support body consisting of the second electrode layer 41, adhesive layer 47, and support layer 48 is preferably sufficiently smaller than that of the piezoelectric layer 43. This facilitates the longitudinal displacement.

Figure 5:
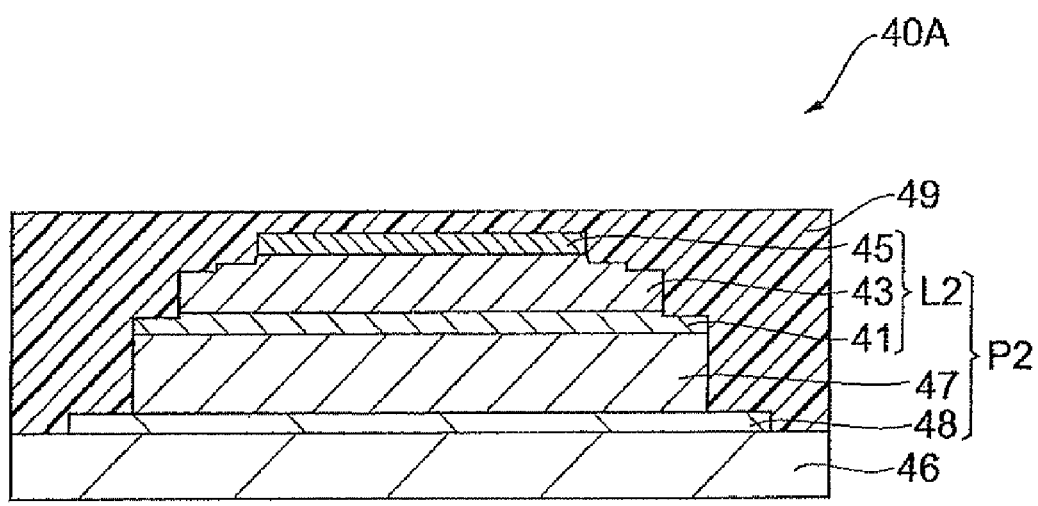
FIG. 5 is a drawing showing a thin-film piezo actuator according to a variation.

The following will describe a variation of the thin-film piezo actuator 40 according to the present embodiment, with reference to FIG. 5. FIG. 5 is a sectional view of a thin-film piezo actuator 40A of the variation, corresponding to FIG. 4 of the thin-film piezo actuator 40. As shown in FIG. 5, the thin-film piezo actuator 40A is different from the thin-film piezo actuator 40 in that the thin-film piezo actuator 40A further comprises a resin layer 46 below the support layer 48 and the resin layer 49 is provided so as to also cover the adhesive layer 47, support layer 48, and resin layer (insulating layer) 46 as well as the laminate L2. Since the other configuration is the same as that of the thin-film piezo actuator 40, the same reference symbols are given thereto, without redundant description.

There are no particular restrictions on a material of the resin layer 46 as long as it is a resin adhesive to the support layer 48; for example, the material of the resin layer 46 can be the same as the adhesive layer 47. There are no particular restrictions on the thickness of the resin layer 46, but it can be, for example, approximately 0.3-30 μm. This constituent member may be a material such as insulating ceramics instead of the resin and there are no particular restrictions on the thickness thereof; for example, it can be approximately 0.005-1 μm.

Since the thin-film piezo actuator 40A of the variation has the configuration wherein the lower resin layer 46 and the upper resin layer 49 wholly cover the laminate P2 composed of the laminate L2, adhesive layer 47, and support layer 48 and being the single-layer piezoelectric laminate, it can achieve the same effect as the thin-film piezo actuator 40 and can also enjoy additional effects as described below. Namely, this configuration further cancels the reduced warpage of the laminate P2 and prevents the laminate P2 from being damaged by external stress. In addition to the insulation and protection of the surface of the piezoelectric layer 43, the above configuration can prevent moisture absorption, corrosion, etc. of the entire thin-film piezo actuator 40A. Furthermore, it can improve bond strength of the interface to the constituent members in contact with the adhesive layer 47 and thus ensure higher reliability of the device.

Production steps of the thin-film piezo actuator 40 will be described below with reference to FIGS. 6 to 11. FIG. 6A, FIG. 7A, FIG. 8, FIG. 9A, FIG. 1 QA, and FIG. 11 are schematic diagrams for explaining the production steps of the thin-film piezo actuator 40. FIG. 6B is a schematic view showing a sectional configuration along a line VIb-VIb in FIG. 6A. FIG. 7B is a schematic view showing a sectional configuration along a line VIIb-VIIb in FIG. 7A. FIG. 9B is a schematic view showing a sectional configuration along a line IXb-IXb in FIG. 9A. FIG. 10B is a schematic view showing a sectional configuration along a line Xb-Xb in FIG. 10A. The thin-film piezo actuator 40 is completed, for example, through the following steps.

Figure 6A:
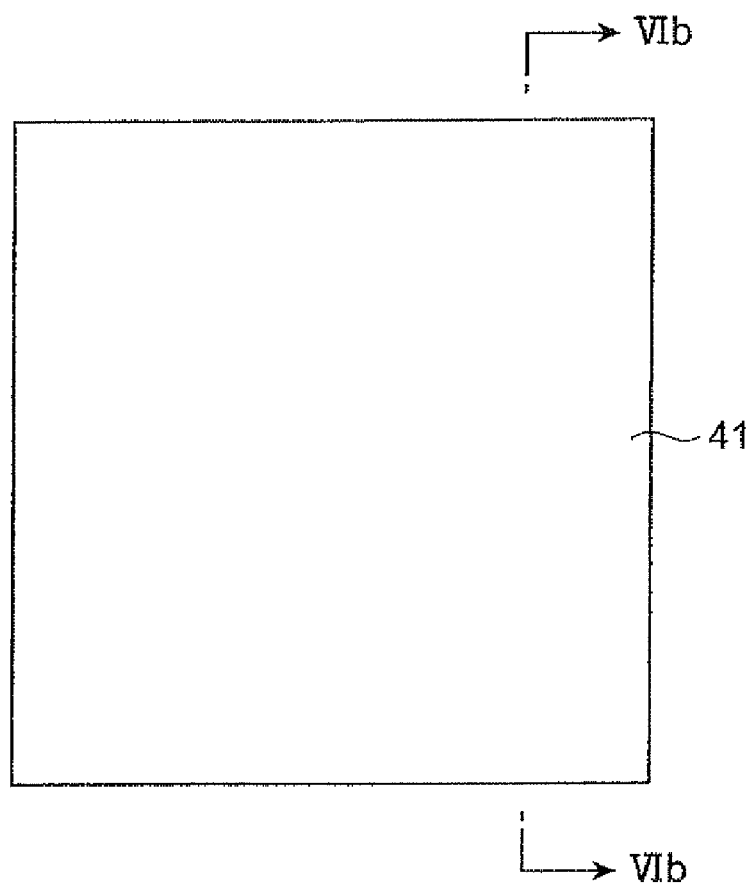
FIGS. 6A and 6B are drawings schematically showing a step in a production method of the thin-film piezo actuator according to an embodiment of the present invention.
Figure 6B:
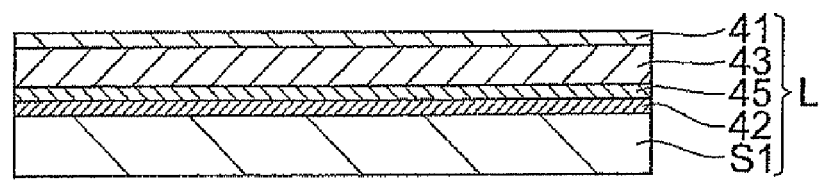

(First Laminate Forming Step) This step is to form a laminate (first laminate) L (cf. FIGS. 6A and 6B). First, a first substrate S1 is prepared. Then a buffer layer 42, a first electrode layer 45, a piezoelectric layer 43, and a second electrode layer 41 are successively stacked on the first substrate S1. For stacking these layers, the epitaxial growth method can be applied. More specifically, the buffer layer 42 is first epitaxially grown on the first substrate S1. The buffer layer 42 can be an epitaxially grown layer oriented along the (100) direction, (010) direction, or (001) direction and, for example, having a top surface of {111} facet plane.

The subsequent step is to epitaxially grow the first electrode layer 45 and the piezoelectric layer 43 in order on the buffer layer 42 and to further form the second electrode layer 41 on the piezoelectric layer 43. This process results in forming the laminate L consisting of the first substrate S1, buffer layer 42, first electrode layer 45, piezoelectric layer 43, and second electrode layer 41. The piezoelectric layer 43 is grown as an oriented piezoelectric layer in which the crystal orientation direction is aligned with the polarization direction (001), thereby obtaining a ferroelectric layer to induce spontaneous polarization which is a phenomenon in which a material makes electric dipoles without application of an external electric field. The laminate L can be formed by applying a deposition method such as sputtering or CVD as the epitaxial growth method.

There are no particular restrictions on a material of the first substrate S1 as long as the laminate L can be formed thereon; for example, the material of the first substrate S1 can be Si, MgO, or the like. There are no particular restrictions on the thickness of the first substrate S1, but it can be, for example, approximately 100-3000 μm. There are no particular restrictions on a material of the buffer layer 42 as long as it allows control of lattice constant mismatch and orientation direction so as to enhance crystallinity of the piezoelectric layer 43; for example, the material of the buffer layer 42 can be $ZrO_2$ layer, $Y_2O_3$ layer, or the like. There are no particular restrictions on the thickness of the buffer layer 42, but it can be, for example, approximately 0.003-0.1 μm.

Figure 7A:
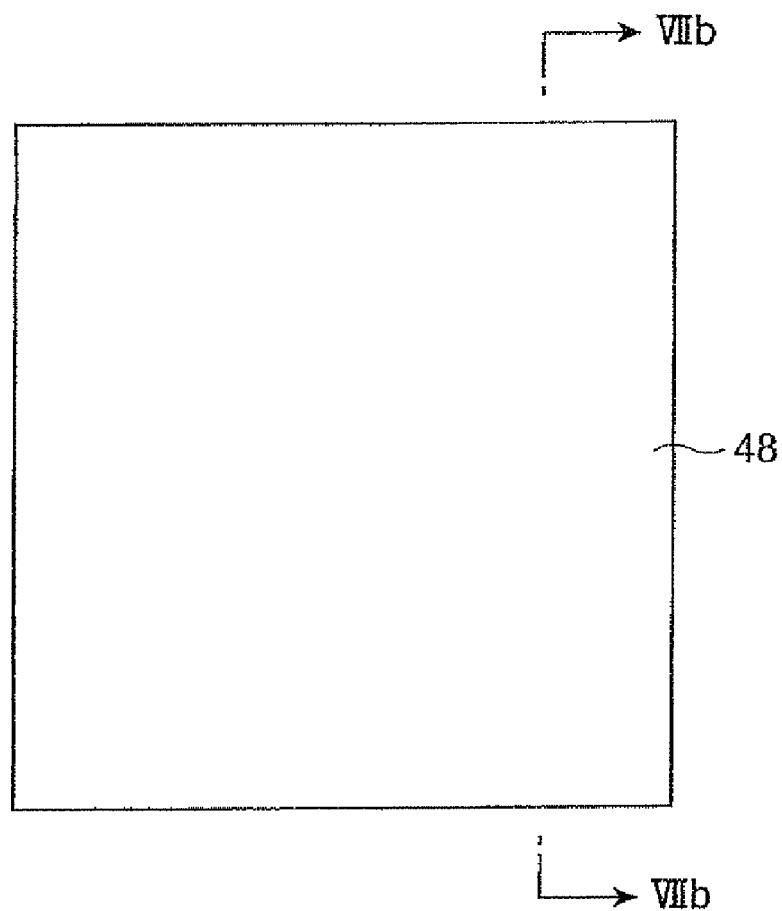
FIGS. 7A and 7B are drawings schematically showing a step in a production method of the thin-film piezo actuator according to the embodiment of the present invention.
Figure 7B:

(Second Laminate Forming Step) The next step is to form a laminate (second laminate) M (cf FIGS. 7A and 7B). First, a second substrate 52 is prepared and an underlying layer 44 and a support layer 48 are successively stacked on the second substrate 52. These layers can be stacked by an ordinary thin-film forming method such as vapor deposition, sputtering, or plating. This process results in forming the laminate M consisting of the second substrate S2, underlying layer 44, and support layer 48.

There are no particular restrictions on a material of the second substrate S2 as long as the laminate M can be formed thereon; for example, the material of the second substrate S2 can be ceramics such as Si, glass, and alumina. There are no particular restrictions on the thickness of the second substrate S2, but it can be, for example, approximately 100-3000 μm. There are no particular restrictions on a material of the underlying layer 44 as long as it can ensure adhesion between the second substrate S2 and the support layer 48; for example, the material of the underlying layer 44 can be SRO, Cr, or the like. There are no particular restrictions on the thickness of the underlying layer 44, but it can be, for example, approximately 0.01-0.3 μm.

Figure 8:
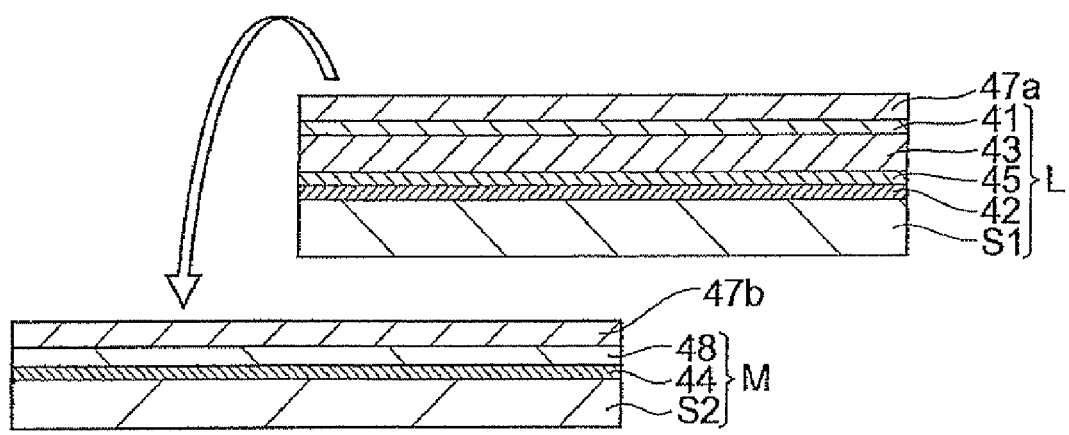
FIG. 8 is a drawing schematically showing a step in a production method of the thin-film piezo actuator according to the embodiment of the present invention.

(Third Laminate Forming Step) This step is first to form an adhesive layer 47a on the second electrode layer 41 of the laminate L and to form an adhesive layer 47b on the support layer 48 of the laminate M (cf. FIG. 8). The adhesive layers 47a and 47b can be formed, for example, by so-called vapor deposition polymerization to vaporize a monomer and polymerize it at the same time as deposition on the support layer 48. The adhesive layers 47a, 47b can also be formed by a method of applying a resin forming the adhesive layers by spin coating.

Thereafter, the adhesive layers 47a, 47b are superimposed on each other so that the second electrode layer 41 and the support layer 48 are opposed to each other; they are bonded under pressure by thermal cure to form a laminate P consisting of the laminate L, adhesive layers 47a, 47b, and laminate M (cf. FIG. 9B). The adhesive layers 47a and 47b come to constitute an adhesive layer 47. The adhesive layer 47 may be formed by a method using an ordinary-temperature curing type adhesive or a method using a hot-melt type adhesive or the like, as well as the thermal cure method; in a case where the adhesive layer 47 is, for example, an ultraviolet (UV) cure type epoxy resin, it is preferable to adopt a bonding method by UV irradiation. This step can also be implemented by forming only one of the adhesive layers 47a and 47b and bonding it to the counter laminate. Furthermore, in cases where the process requires position alignment, it is also preferable to use a thermosetting & UV curing combinational type adhesive.

Figure 9A:
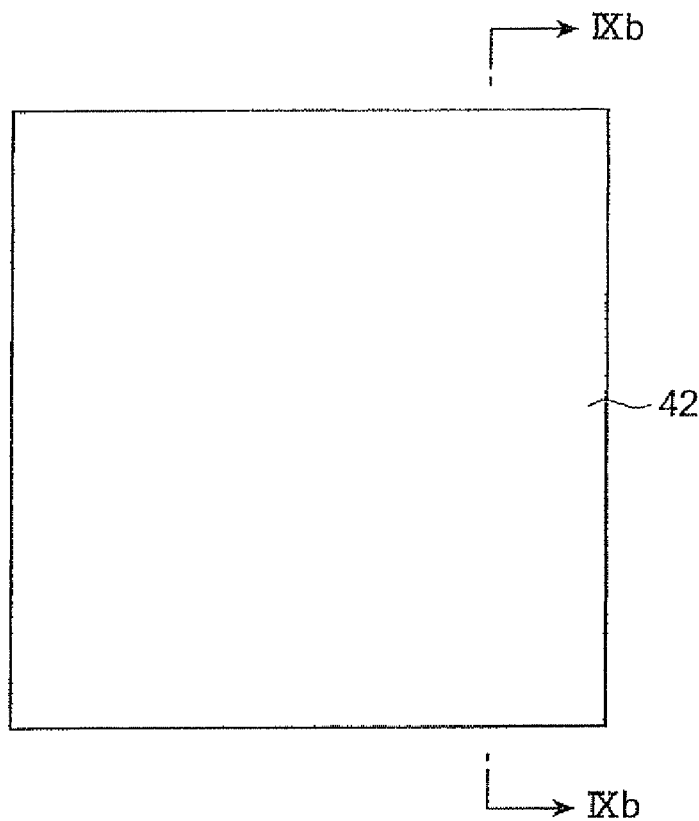
FIGS. 9A and 9B are drawings schematically showing a step in a production method of the thin-film piezo actuator according to the embodiment of the present invention.
Figure 9B:
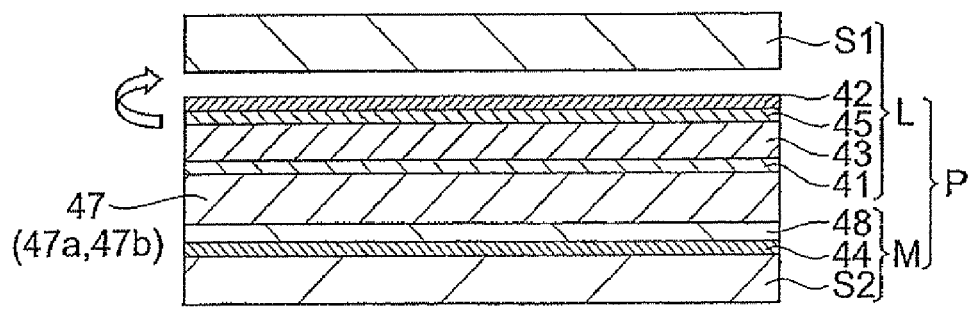

The next step is to remove the first substrate S1 from the laminate L (cf. FIGS. 9A and 9B). In the case like the present embodiment where the first substrate S1 is a substrate of a single crystal of Si, the first substrate S1 can be removed by wet etching with a mixture of hydrofluoric acid and nitric acid, or by dry etching such as reactive ion etching (RIE). Rough polishing in a preceding stage can be performed to remove the substrate by whetstone grinding (vertical), polishing with colloidal silica (CMP), or polishing with diamond slurry using a soft metal platen (tin platen or the like). Thereafter, the buffer layer 42 is etched by RIE. This process results in removing the first substrate S1 and buffer layer 42 from the laminate L and thereby obtaining a laminate L2 consisting of the second electrode layer 41, piezoelectric layer 43, and first electrode layer 45.

Figure 10A:
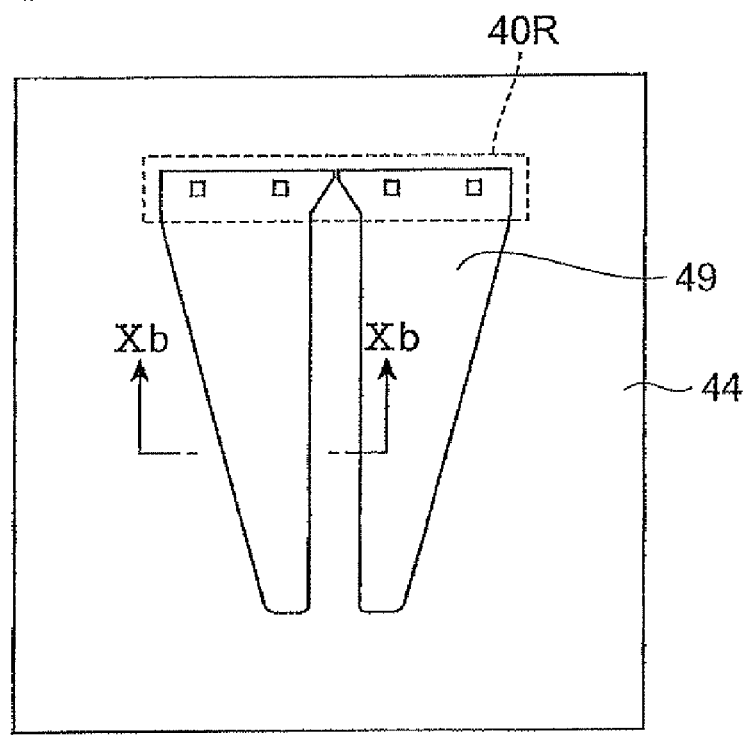
FIGS. 10A and 10B are drawings schematically showing a step in a production method of the thin-film piezo actuator according to the embodiment of the present invention.
Figure 10B:
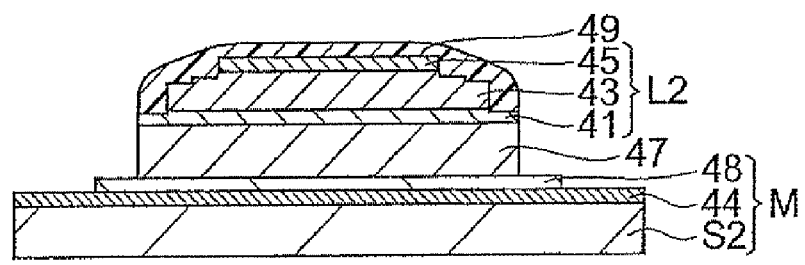
Figure 11:
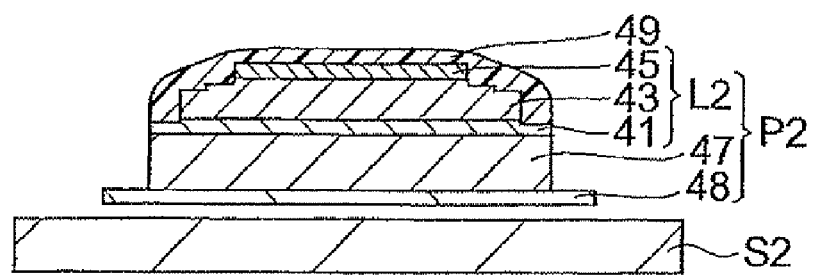
FIG. 11 is a drawing schematically showing a step in a production method of the thin-film piezo actuator according to the embodiment of the present invention.

(Laminate Processing Step) The following step is to process the laminate L in a desired shape (patterning) (cf. FIGS. 10A and 10B). This step is first to form a resist pattern (not shown) in a shape corresponding to the first region 40a and the second region 40b by photolithography and etching technology. Thereafter, an unmasked region is etched using the resist pattern as a mask until the underlying layer 44 is exposed, and the resist pattern is then removed.

Next, in order to avoid corrosion of the second electrode layer 41, piezoelectric layer 43, and first electrode layer 45, a resin layer 49 is formed so as to cover these layers. The resin layer 49 is formed by applying a resin material to become the resin layer 49, and then baking it. Thereafter, the electrodes 41a, 45a and the electrodes 41b, 45b for applying the drive voltage are formed on the base region 40R of the first region 40a and the second region 40b, respectively, on the resin layer 49.

(Second Substrate Removing Step) The next step is to remove the underlying layer 44 by wet etching (cf. FIG. 11). This process results in removing the second substrate S2 from the laminate M. As a result, the laminate P turns into a laminate P2 consisting of the laminate L2, the adhesive layer 47, and the support layer 48. The thin-film piezo actuator 40 shown in FIG. 4 is completed through the above steps. The underlying layer 44 may be made of such a material as an insulating protecting layer, e.g., $ZrO_2$ layer or $Y_2O_3$ layer. In this case, this underlying layer 44 is not patterned, the patterned laminate P is held on some base material through wax or the like on the resin layer 49 side, thereafter the second substrate S2 is removed by dry etching or wet etching or the like, and then the wax or the like is melted to singulate the device. In this case, the portion of underlying layer 44 on the top surface of which the device is absent is broken during the singulation of the device. This method can reduce damage to the device during etching.

According to the production method of the thin-film piezo actuator 40 of the present embodiment, the forming step of laminate L produces various stresses between the piezoelectric layer 43 and the first substrate S1 due to heat, crystal lattice constant mismatch, etc., the various stresses are released by removal of the first substrate S1 in the step of removing the first substrate S1, and the various stresses released are transferred to the second substrate S2. At this time, since the adhesive layers 47a and 47b of the material having the Young's modulus smaller than that of the piezoelectric layer 43 are interposed between the piezoelectric layer 43 and the second substrate 52, the adhesive layer 47 relaxes the various stresses to be transferred to the second substrate 52. For this reason, even though the thin-film piezo actuator 40 obtained by the production method of the present embodiment consists of the single-layer piezoelectric laminate, the warpage and flexural displacement of the device is effectively suppressed.

Furthermore, the laminate P is formed so that the adhesive layer 47 is sandwiched between the second electrode layer 41 and the support layer 48, and the respective Young's moduli of the second electrode layer 41 and the support layer 48 are larger than that of the adhesive layer 47. For this reason, the warpage and flexural displacement of the device is more suppressed and the support body can be formed while suppressing the hindrance to displacement amount u(l) of the piezoelectric layer 43. Since the actuator consists of the single-layer piezoelectric laminate, the production cost thereof is reduced. Therefore, the production method of the thin-film piezo actuator 40 according to the present embodiment permits us to readily produce the thin-film piezo actuator capable of achieving higher performance, higher reliability, and lower cost by the single-layer piezoelectric laminate.

In production of the laminate L, the buffer layer 42 with the top surface of {111} facet plane is formed on the first substrate S1 before the epitaxial growth of the first electrode layer 45, whereby the first electrode layer 45 can be obtained with high crystalline orientation. This also improves the crystallinity of the piezoelectric layer 43 epitaxially grown on the first electrode layer 45, which can improve the reliability of the thin-film piezo actuator 40.

The thermal cure method is applied to formation of the laminate P consisting of the laminate L, adhesive layer 47a, adhesive layer 47b, and laminate M, and the respective coefficients of thermal expansion of the second electrode layer 41 and the support layer 48 are smaller than that of the adhesive layer 47. This makes tensile stresses applied toward the center of the adhesive layer 47 because of the difference between the coefficients of thermal expansion of the second electrode layer 41 and support layer 48 and the coefficient of thermal expansion of the adhesive layer 47 during contraction due to thermal cure, whereby the stresses cancel each other, so as to further reduce the warpage of the laminate P.

Furthermore, in the case of the double-layered piezoelectric laminate structure as in the conventional technology, correct characteristics of the device can be evaluated only after removal of the both-side substrates hindering displacement; whereas, because the production method of the present embodiment involves patterning the piezoelectric layer 43 formed through the adhesive layer 47 on the second substrate S2, the characteristics such as permittivity of the device can be correctly evaluated even in measurement in a wafer level.

The thin-film piezo actuator 40A of the variation can be made as follows: a resin layer 46 is further formed between the underlying layer 44 and the support layer 48 in the forming step of laminate M; after the step of processing the laminate, a resin material to become the resin layer 49 is applied so as to further cover the adhesive layer 47, support layer 48, and resin layer 46, and then cured in formation of the resin layer 49.

This production method of the thin-film piezo actuator 40A of the variation achieves the same effect as the production method of the thin-film piezo actuator 40 of the embodiment and further achieves the following effects. Namely, the thin-film piezo actuator can be readily produced while further canceling the reduced warpage of the laminate P2 and suppressing damage to the laminate P2 by external stress.

The following will describe an example of an assembling process of HGA 10 with reference to FIG. 3. First, the flexure 30 is fixed to the suspension arm 20 by laser spot welding. The thin-film piezo actuator 40 is positioned relative to the flexure 30 and thereafter fixed with a UV curing adhesive or the like so that the support layer 48 is in contact with the piezo actuator mounting region 36. Thereafter, the electrodes are connected to the corresponding electrode pads 39a-d on the rear end 36b of the piezo actuator mounting region 36 so that an alternating current is applied in reverse phases to the electrode 41a on the first region 40a and to the electrode 41b on the second region 40b in the thin-film piezo actuator 40. Then the head slider 50 is mounted on the head slider mounting region 38 and displacement transfer plate 33 and is fixed with an adhesive or the like. The recording pads and reproducing pads on the head slider 50 are bonded to the recording electrodes and the reproducing electrodes on the head slider mounting region 38, thereby obtaining HGA 10.

When HGA 10 is assembled using the thin-film piezo actuator 40 obtained by the aforementioned production method, HGA 10 can be fabricated with higher performance, higher reliability, and lower cost. Since the above-described assembly of HGA 10 involves fixing the thin-film piezo actuator 40 to the piezo actuator mounting region 36 so that the support layer 48 is in contact with the piezo actuator mounting region 36, the first electrode layer 45 of the thin-film piezo actuator 40 is positioned on the bottom surface side of the displacement transfer plate 33; however, since the thin-film piezo actuator 40 is designed so as to be displaced in the longitudinal direction with application of a voltage, there appears no difference in performance of HGA 10 even if the thin-film piezo actuator 40 is mounted in such an orientation that the first electrode layer 45 is located near the piezo actuator mounting region 36.

The above described the preferred embodiments of the present invention, but the above embodiments can be modified in various ways without departing from the spirit and scope of the present invention. In the thin-film piezo actuator 40 of the embodiment the adhesive layers 47a, 47b are made of epoxy resin, but, without having to be limited to this, they may be made of any material such as polyimide resin, acrylic resin, silicone resin, polyimide silicon resin, or fluororesin as long as the Young's modulus thereof is smaller than that of the piezoelectric layer 43.

The second electrode layer 41 and support layer 48 do not have to be limited to the above contents disclosed, but they may be another material such as ceramics as long as the material is a hard material having the Young's modulus larger than that of the adhesive layers 47a, 47b and having the coefficient of thermal expansion smaller than that of the adhesive layers 47a, 47b.

What is claimed is:

1. A method for producing a thin-film piezoelectric device, comprising:

a step of stacking a first electrode layer, a piezoelectric layer, and a second electrode layer in order on a first substrate to form a first laminate;

a step of stacking a support layer on a second substrate to form a second laminate;

a step of bonding the first laminate and the second laminate through an adhesive layer so that the second electrode layer and the support layer are opposed to each other, to form a third laminate consisting of the first laminate, the adhesive layer, and the second laminate;

a step of removing the first substrate from the third laminate;

a step of processing the third laminate in a desired shape, after the step of removing the first substrate; and a step of removing the second substrate, after the step of processing the third laminate, wherein a Young's modulus of the adhesive layer is smaller than a Young's modulus of the piezoelectric layer,
wherein respective Young's moduli of the second electrode layer and the support layer are larger than the Young's modulus of the adhesive layer, and
wherein the third laminate has no other piezoelectric layer except for said piezoelectric layer.

2. The method according to claim 1,
wherein the step of forming the third laminate comprises forming the adhesive layer by thermally curing an adhesive, and
wherein respective coefficients of thermal expansion of the second electrode layer and the support layer are smaller than a coefficient of thermal expansion of the adhesive layer.

3. A thin-film piezoelectric device comprising a laminate in which a support layer, an adhesive layer, a second electrode layer, a piezoelectric layer, and a first electrode layer are stacked in order,
wherein a Young's modulus of the adhesive layer is smaller than a Young's modulus of the piezoelectric layer,
wherein respective Young's moduli of the second electrode layer and the support layer are larger than the Young's modulus of the adhesive layer, and
wherein the thin-film piezoelectric device has no other piezoelectric layer except for said piezoelectric layer.

4. The thin-film piezoelectric device according to claim 3, further comprising an insulating layer covering a surface of the piezoelectric layer.

5. The thin-film piezoelectric device according to claim 3, further comprising an insulating layer hermetically sealing the laminate.

6. A head gimbals assembly comprising:
a head slider having a thin-film magnetic head which performs at least either recording or reproduction with a recording medium;
a suspension on which the head slider is mounted; and
a thin-film piezoelectric device mounted on a mounting surface of the suspension and configured to displace the head slider relative to the suspension,
wherein the thin-film piezoelectric device is a device comprising a laminate in which a support layer, an adhesive layer, a second electrode layer, a piezoelectric layer, and a first electrode layer are stacked in order,
wherein a Young's modulus of the adhesive layer is smaller than a Young's modulus of the piezoelectric layer,
wherein respective Young's moduli of the second electrode layer and the support layer are larger than the Young's modulus of the adhesive layer, and
wherein the thin-film piezoelectric device has no other piezoelectric layer except for said piezoelectric layer.

7. A hard disk drive comprising the head gimbals assembly as set forth in claim 6.

* * * * *